United States Patent

[11] 3,567,968

[72] Inventor Robert K. Booher
Downey, Calif.
[21] Appl. No. 622,578
[22] Filed Mar. 13, 1967
[45] Patented Mar. 2, 1971
[73] Assignee North American Rockwell Corporation.

[54] GATING SYSTEM FOR REDUCING THE EFFECTS OF POSITIVE FEEDBACK NOISE IN MULTIPHASE GATING DEVICES
2 Claims, 1 Drawing Fig.

[52] U.S. Cl. .......... 307/251, 307/205, 307/220, 307/293
[51] Int. Cl. .......... H03k 19/08, H03k 17/00, H03k 21/00
[50] Field of Search .......... 307/251, 279, 304, 246, 293, 294, 223, 220; 317/234.4

[56] References Cited

UNITED STATES PATENTS

| | | | |
|---|---|---|---|
| 3,267,295 | 8/1966 | Zuk | 307/205 |
| 3,406,346 | 10/1968 | Wanlass | 307/304 |
| 3,395,292 | 7/1968 | Bogert | 307/279 |
| 3,322,974 | 5/1967 | Ahrons | 307/279 |
| 3,233,123 | 2/1966 | Heiman | 307/205 |

OTHER REFERENCES

IBM Tech. Disclosure, J.B. Gillet, vol. 7, No. 16, Nov. 1964, 307-246

*Primary Examiner*—Donald D. Forrer
*Assistant Examiner*—David M. Carter
*Attorneys*—L. Lee Humphries, Frederick H. Hamann and Robert G. Rogers

ABSTRACT: A multiphase gating system which reduces the effects of positive noise normally present at the outputs of stages comprising prior art multiphase gating systems by providing switching means for clamping the outputs of particular stages previously set to a logical true level, to said level during the periods that the stage of the outputs of particular stages are being evaluated as inputs to other stages. If the outputs had been set false before the evaluation, the switching means would not be actuated.

PATENTED MAR 2 1971 3,567,968
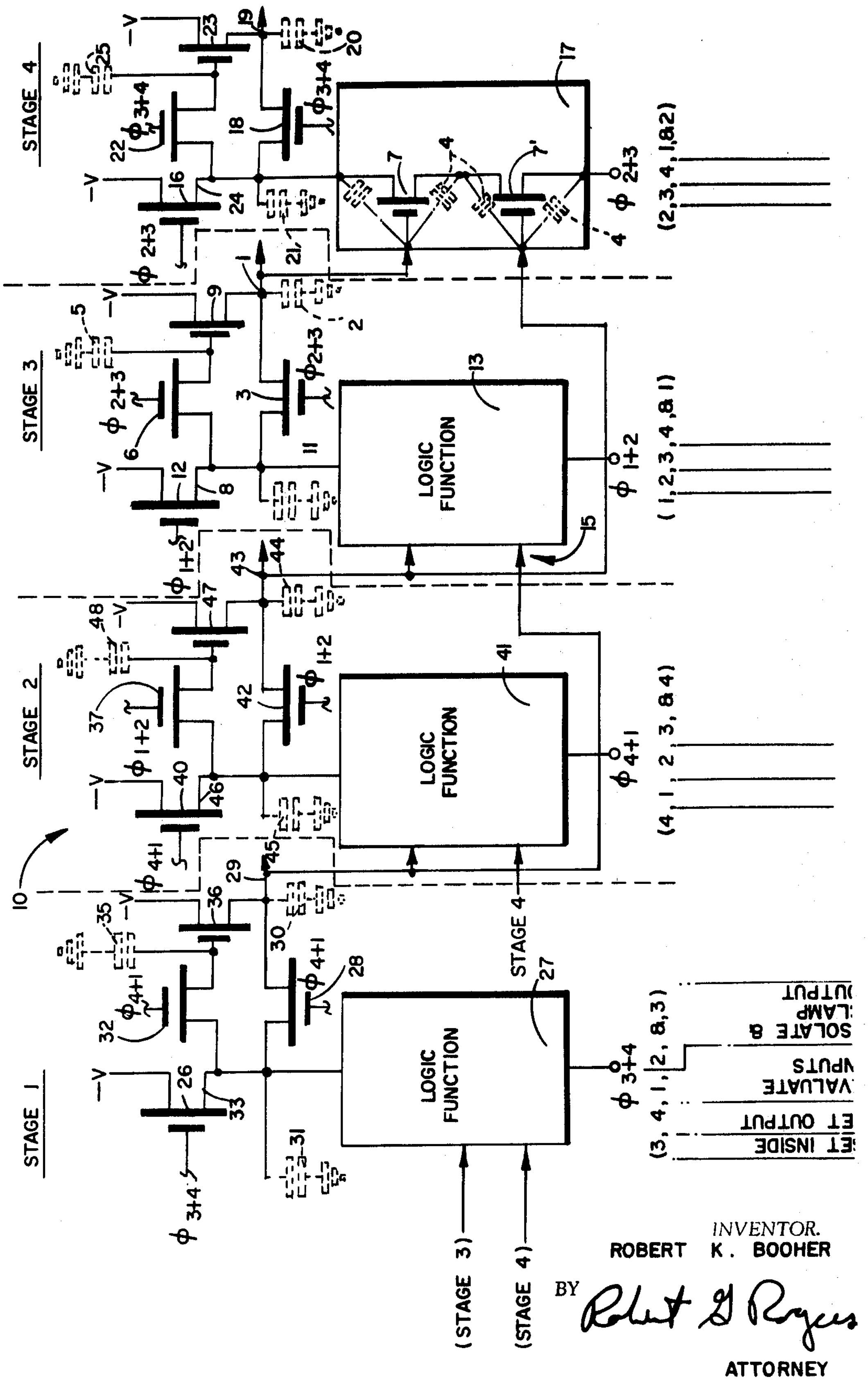
INVENTOR.
ROBERT K. BOOHER
BY Robert G Rogers
ATTORNEY

GATING SYSTEM FOR REDUCING THE EFFECTS OF POSITIVE FEEDBACK NOISE IN MULTIPHASE GATING DEVICES

BACKGROUND OF THE INVENTION

1. Field of the Invention

This invention relates to a gating system for reducing the effects of positive feedback noise at the outputs of multiphase gating devices and, more particularly, to such a system for clamping the outputs of particular stages previously set to a first logical level, to said level during the period that the stage of the outputs are being evaluated as inputs to other stages.

2. Description of Prior Art

During development of compact MOS-IC gating systems, positive voltage levels, described as positive noise herein, were fed back to outputs of previous stages through interelectrode capacitance associated with the inputs to a particular stage. Although the problem is not as pronounced as the problem associated with negative feedback noise, it is still extreme enough to affect the switching speed of MOS devices comprising the various stages of a multiphase gating system. In addition, positive feedback noise is somewhat more difficult to remedy because the capacitance between the substrate and the semiconductor region forming the MOS devices is much lower when the semiconductor region is negatively charged. In other words, if an output had been set to a negative level and subsequently positive noise reduces this negative level to such an extent that when the output was used as an input to other stages, the reduced negative level could interfere with the switching speed of devices using that output. Each volt of positive noise on an output which reduces negative voltage also reduces the overdrive of the devices which use that output as input signals on the gate electrodes of MOS input devices. As a result, the device is switched at a slower rate. If the positive feedback became great enough, a true level might be evaluated by a subsequent stage as a false level.

A detailed description of negative feedback noise, which is also present at the output of multiphase gating devices, is contained in patent application having the title of A Gating System for Reducing the Effects of Negative Feedback Noise in Multiphase Gating Devices, by R. K. Booher, filed on or about Mar. 13, 1967.

As in the case of negative feedback noise, more sophisticated conductor device layouts were attempted in order to reduce the interelectrode capacitance and therefore, the amount of feedback. However, the noise was not appreciably reduced by such changes. Although the noise might have been reduced at one stage it increased at another.

Applicant unaware of any art which solves the problem, although in order to produce a novel MOS switching system, the noise level or its effects must be reduced. Desirably, a system is required for reducing the noise without materially changing the layout of the system, sizes of MOS devices, etc.

SUMMARY OF THE INVENTION

Briefly, the invention comprises a plurality of MOS devices forming a multiphase gating system including means for selectively gating each stage of the system and means for evaluating the inputs to each stage during certain intervals. The inputs are connected to a logic function. The gating sequence comprises means for charging certain of the inherent capacitances of each stage unconditionally true (negative voltage level) during a time interval when the inputs to that stage (outputs of previous stages) are either connected to ground or are set to a negative level. In other words, the capacitor is charged either before or during the time that inputs to the previous stages are evaluated. As a result, negative feedback voltage from that stage to the stages providing inputs to that stage, is connected to ground or it increases an existing negative voltage on the inputs. First means are included for isolating the inherent capacitance associated with the output of that stage during the period that the other capacitors are being charged.

After the inherent capacitances (excluding the output capacitance) are charged, the isolation device is turned on and the output capacitance is charged to a true level. No negative feedback occurs because the other capacitances have previously been charged. Subsequently, the inputs are evaluated and the output either remains true or is set false as a function of the state of the inputs to that stage.

Second means are connected in parallel with the first means clamping the output previously set true to the true level if positive feedback attempts to drive the output significantly toward the false level.

The second means comprises a first switching device connected between the output and a true voltage level, including a control electrode. The control electrode includes an inherent capacitance which is charged when the output capacitance is charged. Second isolation means are included for isolating the capacitance and the control electrodes when the output is isolated. When the output is set to a first or second level as a function of the state of the inputs, the inherent capacitance associated with the control electrode is also set.

As a result, not only are the effects of negative noise reduced, but in addition, the effects of positive noise are also reduced. When the positive noise is fed back to the output, the true voltage level on the output is reduced until the voltage on the control electrode becomes negative by at least one threshold relative to the voltage on the output, at which time the switching device turns on and clamps the output to a true voltage.

Since each stage is comprised of a plurality of MOS devices, the interelectrode capacitance can become sizeable enough to materially alter the voltage at the output of a previous stage.

Positive voltage is fed back to the output of a particular stage through the interelectrode capacitance associated with the input devices of other stages where the output is used when the inputs to the other stages are evaluated. During the evaluation time, the voltage applied to the interelectrode capacitances may increase in a positive direction if a zero voltage is impressed across the logic function to which the inputs are connected. The positive increase comprises the positive feedback voltage.

Therefore, it is an object of this invention to provide a gating system for reducing the effects of positive noise at the outputs of multiphase gating devices.

Still another object of the invention is to provide a gating system for eliminating the effects of positive noise fed back between stages through interelectrode capacitances.

Still another object of this invention is to provide a multiphase gating system in which the effects of positive noise in the system are reduced without the necessity for changing conductor device layout.

Another object of the invention is to provide a gating system for reducing the effects of positive noise on the outputs of stages of a multiphase gating system comprising inputs to other stages for improving the switching time of the device to which the outputs are connected.

A still further object of this invention is to provide means for eliminating the effects of positive noise in a multiphase gating system by clamping the outputs of particular stages to a true logical level during the period that the stage of the output is being evaluated as an input to another stage.

A still further object of the invention is to provide an improved multiphase gating system comprising a plurality of similar stages forming a symmetrically gated multiphase gating system by reducing positive feedback noise between stages.

These and other objects of this invention will become more apparent in connection with the following drawings.

BRIEF DESCRIPTION OF THE DRAWINGS

FIG. 1 represents one embodiment of a system having a gating sequence and clamping means for eliminating the effects of positive feedback noise.

DESCRIPTION OF PREFERRED EMBODIMENTS

FIG. 1 shows one embodiment of a system which eliminates the effects of positive feedback noise by changing the location of certain switching devices, by changing the sequence of gating signals applied to the individual stages, and by adding additional means for clamping the output during certain periods of time. A description including an illustration of a prior art multiphase gating system can be seen by referring to the previously referenced patent application. As indicated in the patent application, it was necessary to change the location of certain switching devices and the sequence of gating system signals applied to individual stages for the purpose of eliminating negative feedback noise. However, even though the negative feedback noise was eliminated, positive feedback noise still existed and additional changes were necessary in order to eliminate the effects of positive feedback noise. The added clamping means eliminates the effects of positive feedback noise.

The embodiment comprises multiphase gating system 10 having stages 1, 2, 3 and 4 gated by phase signals $_1$ through $_4$.

Stage 3 comprises switching device 12 connected between voltage source $-V$ and logic function 13. Switching device 3 is connected between electrode 8 of device 12 and first output 1 including inherent capacitance 2. Although a capacitor is indicated, it should be understood that the capacitance associated with the output is interelectrode and stray capacitance associated with the conductor and substrate at the output terminal. Intercapacitance 11 is shown connected to electrode 8 of device 12. Logic function 13 is connected between electrode 8 of device 12 and alternating voltage source designated as $_1+_2$.

Switching device 6 is connected between electrode 8 of device 12 and switching device 9. Interelectrode capacitance 5 is connected between the control electrode of device 9 and ground. Device 6 has a first electrode connected to control electrode of device 9. Device 9 is connected between voltage source $-V$ and output 1. Control signal designated as $_2+_3$is connected to the control electrodes of devices 3 and 6. Control signal designated as $_1+_2$ is connected to the control electrode of device 12. When the phase signals are true, the devices are turned on.

The function of each stage can best be described in connection with the legends set forth below the stage (see legend beneath stage 1). The first digit represents the phase time during which the inherent capacitance of the stage (excluding the output capacitance and the capacitance 35 connected to the control electrode of device 36) is charged. The second digit represents the phase time during which the output capacitance for the stage is charged. The third digit represents the phase time during which the inputs to the logical function of the stage are evaluated. The last digits represent the phase time during which the output of the stage is stable and can be used as an input to subsequent stages. For example, in stage 3 when $_1+_2$is true, effective capacitance 11, shown connected to electrode 8 of device 12, is set to a $-V$ level. During the true interval of $_2$, effective capacitance 2 comprising the output, is unconditionally set to a level of $-V$. At the same time, effective capacitance 5 comprising a second output, is unconditionally set to a level of $-V$.

During the true interval of $_3$, the state of the various inputs 15 to logic function 13 are evaluated. In other words, if the logic function is true, during $_3$ time, first and second outputs are set false because $_1+_2$ is false during that interval.

During the true intervals of $_4$ and $_1$, the first and second outputs are isolated from other portions of the stage by switching devices 3 and 6. During the isolation period the first output can be used as inputs to other stages. The output must be stable during the time that it is being used by the stages so that a true indication of the stage of the output is given.

Stage 4 includes switching device 16 connected between $-V$ and logic function 17. Switching device 18 is connected between output 19 at a common point between switching device 16 and logic function 17. Stage 4 also includes effective capacitance 20 at the first output and effective capacitance 21 at the junction of switching device 18 and logic function 17. Logic function 17 is shown as comprising two switching devices, 7 and 7', including interelectrode capacitance 4. Second switching device 22 is connected between electrode 24 of device 16 and the control electrode of switching device 23. Effective capacitance 25 is shown as connected between the gate electrode of switching device 23 and ground. Switching device 23 is connected between $-V$ and output 19. The functional sequence for the stage is set forth as a legend beneath the stage.

Stage 1 comprises switching device 26 connected between $-V$ and logic function 27. Switching device 28 is connected between output 29 and the junction of switching device 26 and logic function 27. Stage 1 includes effective capacitance 30 connected at the output and effective capacitance 31 connected at the junction of switching devices and the logic function. Switching device 32 is connected between electrode 33 of switching device 26 and the gate electrode of switching device 36. Switching device 36 is connected between $-V$ and output 29. Inherent capacitance 35 is connected between the gate electrode of switching device 36 and ground. The functional sequence for the stage is set forth as a legend beneath the stage.

Stage 2 includes switching device 40 connected between logic function 41 and voltage source $-V$. Switching device 42 is connected between the output 43 and a common point between switching device 40 and logic function 41. Effective capacitance 44 is connected at the output. Effective capacitance 45 is connected at the junction of the switching devices 42 and 40 and logic function 41. Switching device 37 is connected between electrode 46 of switching device 40 and the gate electrode of switching device 47. Effective capacitance 48 is connected between the gate electrode of switching device 47 and ground. Switching device 47 is connected between $-V$ and output 43. A function of a legend for the device is set forth beneath the device.

The various logic functions may be comprised of one or more devices such as shown in connection with logic function 17. Logic function 17 illustrates two switching devices in series as comprising the function although in application more switching devices may be connected in series or parallel to mechanize the function. Logic function 17 shows interelectrode capacitances 4 for each switching device mechanized having logic function. The devices mechanizing the other logic functions also includes interelectrode capacitances although for convenience, capacitance is only shown in connection with logic function 17.

Outputs from certain of the stages of the system comprise inputs to other stages of the system. For example, the output from stage 3 comprises inputs to the logic function of stage 4 and the logic function of stage 1. Output from stage 4 comprises inputs to the logic function of stage 1 or stage 2. The output from stage 2 comprises inputs to stages 3 and 4. Although two inputs are shown for each logic function, in other embodiments, logic function may have single input or a plurality of inputs. Because the gating sequence of the system is symmetrical, the output from one stage can be used as inputs to the next two stages.

Various switching devices described in connection with the system may be mechanized by MOS transistors having first, second and gate electrodes disposed over a semiconductor substrate. Depending on the type of MOS devices, when a negative voltage appears at the gate electrode of the device, the device is turned on if the control electrode exceeds the voltage at the source electrode by an amount called the threshold voltage of the device. The threshold voltage may be defined as the voltage at which the MOS device turns on. Although the specific MOS devices described herein are *p*-type devices, it should be understood that *n*-type devices may also be used. Voltage levels would be changed for *n*-type devices.

Each of the logic functions of the system has one input connected to clock signals as shown. Logic function 27 is connected to clock signal $_{3}+_{4}$. Logic function 41 is connected to clock signal $_{4}+_{1}$. Logic function 13 is connected to clock signal 101 $_{1}+_{2}$. Logic function 17 is connected to clock signal $_{2}+_{3}$.

In operation, assuming that $_{1}$ is true, capacitor 44 of stage 2 is unconditionally set true. Simultaneously, capacitor 48 of the stage is also unconditionally set true. Similarly, during $_{4}$ time, capacitors 30 and 35 of stage 1 are also unconditionally set true. During $_{3}$ time capacitors 20 and 25 of stage 4 are unconditionally set true. Inputs to stage 4 are evaluated during $_{4}$ time and the output from stage 3 is isolated during that period of time. The output from stage 2 is also isolated. Output 19 from stage 4 comprises inputs to stages 1 and 2. Inasmuch as the remaining portions of the inherent capacitance associated with the stage 4 had previously been charged to a negative level during the true interval of $_{2}$ when $_{2}+_{3}$ is false, the change of voltage across the interelectrode capacitance 4 appears as a positive voltage which is fed back to the outputs of stages 2 and 3. The positive voltage changes the output voltage level of stage 3 and as soon as the voltage on the gate electrode of device 6 is greater by one threshold then the voltage on the output, device 6 turns on and clamps the output to a true level. The same thing occurs with respect to stage 2. As a result, the levels do not change because of the positive feedback. When the output of stage 2 is subsequently used as an input to stage 3, the input stage will be true. If the voltage level had been increased, the state may have appeared false. If the output had been set false (during the evaluation of the inputs), the positive noise would not interfere with the state.

Although the specific description of operation has been given with respect to stages 3 and 4, it should be understood that the other stages function in substantially the same manner. The gating signals are, of course, different. In addition, the various logic functions may not be identical.

Although the invention has been described and illustrated in detail, it is to be understood that the same is by way of illustration and example only, and is not to be taken by way of limitation; the spirit and scope of this invention being limited only by the terms of the appended claims.

I claim:

1. A multiphase gating system comprising:

a plurality of stages with each stage having an output and at least one input, the outputs of certain of said stages comprising inputs to others of said stages, stages;

means for setting the output to either one of a true or false level as a function of the state of the inputs to that stage;

means for clamping said output to a true level if it has been set to a true level by said means for setting and during the period that the output is being used as an input to other stages whereby the effects of positive noise feedback are reduced;

said output including a first inherent capacitance which is either charged or discharged as a function of the state of the inputs;

means for isolating said output from the inputs when the output is being used as an input to the other stages;

said clamping means includes a switching device connected between said output and a true voltage level including a control electrode having a second inherent capacitance associated therewith, said capacitance being charged to either one of a true or false level as a function of the state of the inputs to the stage; and second isolation means connected between said control electrode and said inputs for isolating the control electrode and the second inherent capacitance associated therewith from the inputs when the output is being used as an input to other stages whereby charge on the second inherent capacitance turns the switching device on for resetting the output to said true level if positive noise feedback from said inputs to other stages increases the output voltage level above a predetermined amount.

2. A multiphase gating system comprising a plurality of stages with each stage having an output and at least one input, the output of certain of said stages comprising inputs to others of said stages, each of said stages comprising:

a first field effect transistor having a control electrode;

second field effect transistor means for unconditionally setting the output and the control electrode of said first field effect transistor to a voltage level during a first phase of the operation of said multiphase gating system, said second field effect transistor means including third field effect transistor means for conditionally resetting the output and the control electrode to a different voltage level during a second phase of the operation of said multiphase gating system as a function of the logical state of the inputs to a stage and for isolating the output and said control electrode from the inputs during a third phase of the operation of said multiphase gating system after the voltage level on said output and said control electrode have been conditionally reset during said second phase; and said first field effect transistor connected between said output and a reference voltage level for turning on as a function of a difference between the voltage level at the output and the voltage level on the control electrode of said field effect transistor for clamping said output to the reference voltage level during said third phase of the operation of the multiphase gating system.